(12) United States Patent
Westphal et al.

(10) Patent No.: US 6,479,997 B1
(45) Date of Patent: Nov. 12, 2002

(54) ELECTRIC ARRANGEMENT FOR OPERATION OF A GRADIENT COIL WITH SEVERAL POWER SUPPLIES

(75) Inventors: Michael Westphal, Offenbach (DE); Hartmut Schmidt, Karlsruhe (DE)

(73) Assignee: Bruker Biospin GmbH, Rheinstetten (DE)

( * ) Notice: Subject to any disclaimer, the term of this patent is extended or adjusted under 35 U.S.C. 154(b) by 0 days.

(21) Appl. No.: 09/556,659

(22) Filed: Apr. 24, 2000

(30) Foreign Application Priority Data

May 3, 1999 (DE) .......................................... 199 20 085

(51) Int. Cl.⁷ .............................................. G01V 3/00
(52) U.S. Cl. ........................................ 324/318; 324/322
(58) Field of Search ................................. 324/318, 320, 324/322

(56) References Cited

U.S. PATENT DOCUMENTS

| | | | |
|---|---|---|---|
| 4,840,700 A | * 6/1989 | Edelstein | .................... 324/318 |
| 4,928,063 A | 5/1990 | Lampmann | |
| 5,113,145 A | 5/1992 | Ideler | |
| 5,311,135 A | * 5/1994 | Vavrek et al. | .............. 324/318 |
| 5,323,135 A | 6/1994 | Schmidt | |
| 5,343,148 A | 8/1994 | Westphal | |
| 5,563,567 A | 10/1996 | Westphal | |
| 5,666,054 A | 9/1997 | Westphal | |
| 5,689,189 A | * 11/1997 | Morich | ........................ 324/318 |
| 5,729,141 A | * 3/1998 | Hass et al. | .................. 324/318 |
| 5,959,454 A | 9/1999 | Westphal | |

FOREIGN PATENT DOCUMENTS

DE  39 07 141  9/1994

* cited by examiner

Primary Examiner—Edward Lefkowitz
Assistant Examiner—Dixomara Vargas
(74) Attorney, Agent, or Firm—Paul Vincent

(57) ABSTRACT

A gradient coil system comprises a gradient coil for generating a rapidly changing magnetic gradient field in a working volume of a magnetic resonance apparatus, with a current path guided in windings on the surface of a geometric body, the geometry of which results in the desired spatial dependence of the magnetic field of this gradient coil in the working volume. N current power supplies (NG1, NG2) can be controlled with an analog or digital control signal to each generate a time-dependent controlled electric current (i1, i2) proportional to the control signal. The current path is divided into several parallel conductor paths which are electrically insulated from one another, and which form a doubly or multiply wound transformer, wherein the inductances of the various conductor paths with respect to one another as well as the mutual inductances with respect to one another have approximately the same value L. The ends of each conductor path are each connected to one respective current power supply (NG1,NG2), and the current power supplies (NG1, NG2) can be controlled with control signals in such a manner as to supply the same current (i1, i2) to the conductor paths at all times. This enables operation of a gradient coil with several current power supplies in such a manner that, should the dependencies of the currents of the current power supplies not be precisely identical, generation of disturbing magnetic fields having a geometry which differs considerably from the desired geometry for the gradient coil is prevented.

13 Claims, 7 Drawing Sheets

ELECTRIC ARRANGEMENT FOR OPERATION OF A GRADIENT COIL WITH SEVERAL POWER SUPPLIES

This application claims Paris Convention priority of DE 199 20 085 filed May 3, 1999 the complete disclosure of which is hereby incorporated by reference.

BACKGROUND OF THE INVENTION

An electric arrangement, with a gradient coil for generating magnetic gradient fields, which rapidly change with time, in the working volume of a magnetic resonance apparatus, with a current path guided in winding on the surface of a geometric body, the geometry of which results in the desired spatial dependence of the magnetic field of said gradient coil in the working volume, and with N current power supplies which can be controlled by an analog or digital control signal to each generate a controlled time-dependent electric current which is proportional to the control signal.

An electric arrangement of this type is disclosed e.g. in U.S. Pat. No. 4,928,063.

An essential component of nuclear magnetic resonance (NMR) apparatus, generally used for tomography, but sometimes also for spectroscopy, is a system of normally three gradient coils consisting of several partial coils which are independently supplied with currents of different strengths. These gradient coils superimpose spatially constant magnetic field gradients of adjustable strength on a homogeneous magnetic field B0z, extending along a z-axis, of the main field magnet of the NMR apparatus, wherein the direction of one of these gradients (dBz/dz) extends generally parallel to the direction of the homogeneous main field B0z (z gradient=axial gradient), and the two other gradients (dBz/dx, dBz/dy) are mutually orthogonal and transverse to the direction of the main field (x and y gradients=transverse gradients). The strength of the gradient field is designated with g (g=dBz/dr, r=x or y or z). The volume within which the magnetic fields of these gradient coils have an approximately linear dependence can be used for NMR methods requiring spatial resolution (imaging, spatially selective spectroscopy) if this volume is not further constrained by inhomogeneities in the main field.

A further essential component of a magnetic resonance apparatus is the current power supply for the gradient coils. This unit supplies an electric current I, which can be generated within wide limits, into a gradient coil with a precisely determined time dependence. The time dependence of the electric current is generally specified by an analog or digital control signal which serves as command variable for a control loop, wherein the electric current is controlled in correspondence with the time dependence of this command variable. Current power supplies which are particularly advantageous for these applications and which have particularly low electrical power losses are constructed as cycled switching power supplies and are described e.g. in U.S. Pat. No. 5,113,145. The gradient coil, constituting a substantially inductive load, is thereby connected via a transistor, acting as a switch S, to an electric voltage source having constant voltage U and is charged quickly. When the switch S is open, the coil decharges slowly via a recovery diode D connected in parallel to the coil. The current in the coil therefore remains largely constant for short switch opening times. Current regulation is thereby principally effected by adjusting the cycling times with which the switch is closed or opened.

The properties of a magnetic resonance apparatus improve with increasing maximum gradient strength gmax generated with the three gradient coils and with increasing maximum change in the gradient strength dg per unit time dt,(dg/dt)max. Both properties are suitably combined as product in a dynamic characteristic variable kdyn=gmax*(dg/dt)max.

The gradient coils may e.g. be x-, y- and z-coils disposed on cylindrical surfaces for conventional tomography magnets or be gradient coils for gradient accelerated NMR spectroscopy. In addition, flat gradient plates for pole shoe magnets have also been used in NMR tomography. U.S. Pat. No. 5,666,054 and U.S. Pat. No. 5,563,567, the complete disclosure of which are hereby incorporated by reference, extensively describe the spatial construction of other possible geometrical arrangements of gradient coils.

U.S. Pat. No. 5,323,135 describes a particularly advantageous gradient coil system, wherein the inductance L can be optimized for given boundary conditions and additional technically relevant parameters of the magnet coil arrangement, such as e.g. current density distributions, shielding effect etc. can also be optimized, independently of one another. The shielding effect describes the degree to which high quality gradient coils generate minimum or theoretically vanishing stray magnetic fields in the vicinity of the main field magnet. This is advantageous since the gradient fields, varying rapidly with time, which are generated by these gradient coils, do not induce eddy currents in the metal structure of the main field magnet, the additional magnetic fields of which would be superimposed on the magnetic field of the gradient coil and distort same in a disturbing manner.

A common feature of all gradient coils mentioned herein, is that they are constructed from an even number of at least two partial coils, arranged symmetrically with respect to one another to generate the normally desired spatially symmetric magnetic field strength dependence. In principle, these partial coils can be generated using two symmetry operations: mirrored reflection on a plane by rotation about an axis through 180 degrees. The transverse gradient coils disclosed e.g. in U.S. Pat. No. 5,323,135 comprise four such partial coils disposed on the surface of a circular cylinder. The transverse gradient coils disclosed in U.S. Pat. No. 5,343,148 comprise two partial coils disposed on the surface of a circular cylinder. Axial gradient coils and coils for generating a homogeneous magnetic field consist in general of two partial coils arranged on the surface of a circular cylinder. The transverse gradient coils disclosed in U.S. Pat. No. 5,959,454 consist of two partial coils arranged in a common plane.

In many cases, a gradient coil is constructed from one single conductor path extending along the current path guided in windings on the surface of a geometric body, which is connected to one single current power supply. For the dynamic performance data of such an arrangement, the following holds:

gmax=g0*Imax
(dg/dt)max=(g0/L)*Umax
kdyn=(g0*g0)*Imax*Umax, wherein g0 is the gradient strength per current magnitude unit (normalized gradient strength), L the inductance of the coil, Imax the maximum current magnitude of the current power supply, and Umax the maximum electric voltage of the current power supply.

For given performance data for the current power supply, Imax and Umax, the e.g. maximum gradient strength gmax can be adjusted within large limits by constructing the gradient coil with more or less windings, since the normalized gradient strength is proportional to the number of windings W of the current path. Since the inductance L is inversely proportional to the square of the number of windings W, an increase in the maximum gradient strength gmax is linked with a corresponding reduction in the maximum change with time of the gradient strength (dg/dt)max.

The dynamic characteristic variable kdyn thereby remains unchanged. The dynamic characteristic variable kdyn can also be maximized by maximizing the characteristic parameter of the gradient coil (g0*g0/L) through adjustment of the detailed dependence of the geometry of the current path. Methods therefor are e.g. described in the above mentioned U.S. Pat. No. 5,323,135. A further increase in the dynamic characteristic variable kdyn is only possible by increasing the performance values Imax and Umax of the current power supply. These performance values also depend on technical limits. Typical performance values of modern cycled switching power supplies are about Imax=600 A and Umax=400 V.

To further improve the dynamic characteristic variables kdyn one could use, in principle, several current power supplies electrically connected in series or in parallel. However, due to their manner of operation, the outputs of cycled switching power supplies can, in principle, not be galvanically connected to one another. One conceivable solution is given by the electric arrangement described in the above cited U.S. Pat. No. 4,928,063. In this conventional arrangement, the gradient coil is divided into several partial coils, each having one conductor path, which, due to the usually large symmetry, are spatially separated from another, wherein the conductor paths of the various partial coils are galvanically separated from one another and are each connected to a current power supply. The current power supplies supply currents, with identical current time dependencies, to the respectively connected partial coils.

This system leads, however, to problems when the time dependencies of the electric currents of the current power supplies are not completely identical as a result of imperfect current control, since the individual partial coils each generate magnetic fields in the working volume having geometries which completely differ from the desired geometry of a spatially constant gradient. Only the superposition of these individual magnetic fields with the same strength, i.e. generated by identical currents, leads to the desired constant gradient magnetic field geometry. If the currents in the partial coils are not identical, perturbing magnetic fields are therefore generated having a geometry differing from the desired geometrical shape. This impairs or even prevents proper functioning of the magnetic resonance apparatus.

It is therefore the underlying purpose of the present invention to facilitate operation of a gradient coil with several current power supplies in an electric arrangement of the kind described above in such a manner that, when the time dependencies of the current from the current power supplies are not exactly identical, no perturbing magnetic fields are generated having a geometrical shape differing substantially from the geometrical shape desired for the gradient coil.

SUMMARY OF THE INVENTION

This object is achieved in accordance with the invention in that the current path is divided into several conductor paths guided parallel to one another and electrically insulated from one another, which form a doubly or multiply wound transformer, wherein the inductances of the various conductor paths with respect to one another and the mutual inductances with respect to one another have approximately the same value L (L=average value of the inductances), wherein the ends of each conductor path are connected to one respective current power supply and the current power supplies can be controlled by control signals in such a manner as to supply approximately the same current to the conductor paths at all times.

In the arrangement in accordance with the invention, each of the parallel conductor paths generates a magnetic field with the desired spatial dependence in the working volume. Slightly different currents in various conductor paths do not thereby result in a perturbing magnetic field having a spatial dependence which differs from that desired for the gradient coil.

The conductor paths, extending parallel to one another, can be disposed on the surface of the geometric body next to one another or one closely on top of the other.

An embodiment of the invention is particularly preferred in which the conductor paths are further divided into partial conductor paths and new conductor paths are formed by electric parallel connections of partial conductor paths. In this manner, e.g. a current path can be divided into four partial conductor paths for operation with two current power supplies, wherein the ends of the two inner partial conductor paths are connected in parallel and form a first new conductor path and wherein the ends of the two outer partial conductor paths are also connected in parallel and form a second new conductor path. The partial conductor paths of the second new conductor path surround the first new conductor path along its entire length. In this manner, the inherently small spatial differences in the magnetic fields generated in the working volume by the two new conductor paths are particularly small, for identical current strengths.

One embodiment of the invention is particularly preferred with which the parallel conductor paths have approximately the same electrical resistance. In this way, the electrical power losses in the various conductor paths, leading to heating up of the conductor paths, are identical and none of the individual conductor paths is overheated.

One embodiment of the invention is particularly preferred with which a number of N−1 transformers, each having two similar, preferably doubly wound windings of approximately identical inductances and mutual inductances are provided, and each conductor path of the gradient coil is electrically connected in series with a winding of at least one transformer. When currents flow in the same direction through the conductor paths connected in series with the windings, currents flow in opposite directions through the two windings of the respective transformer, wherein each of the two conductor paths connected to the same transformer, are designated as "equivalent" and all conductor paths of the gradient coil become "equivalent" to one another due to such connection to one or more transformers.

Only in the event of (undesired) oppositely directed current flow in the conductor paths of the gradient coil, is a magnetic field and an associated stored energy generated in the transformers, but not for (desired) current flow in the same direction.

The situation is precisely opposite for the conductor paths of the gradient coil which, together, also constitute a transformer. Since the currents in the various conductor paths are individually controlled by the current power supplies connected thereto, transient opposing currents in the conductor paths is, in principle, possible. For the above-mentioned reason, the gradient coil does not provide an inductive resistance to such oppositely directed currents, rather functions as a short circuit. Without transformers, this would support the generation of oppositely directed currents in the conductor paths leading to unstable operation of the current controls of the current power supplies connected to the gradient coil. The additional transformers provide an inductive resistance for currents of opposite direction and stabilize operation of the current power supplies. In the case of (desired) operation of the parallel conductor paths with identical currents and correspondingly similar changes in the currents per unit time during charging or discharging, no magnetic field builds up or decays in the transformers due to the oppositely directed windings. For this reason, the transformers do not constitute additional inductive resistance for this type of operation. They therefore do not increase the inductance of the gradient coil or of the conductor paths of the gradient coil and thereby do not impair the dynamic characteristic variable kdyn of the system.

An embodiment of the invention is particularly preferred with which the number N of simultaneously used current power supplies and therefore the number of parallel guided conductor paths is 2 and the number of transformers is 1. The practical construction of the electric arrangement is thereby particularly straightforward.

Moreover, an embodiment of the invention is preferred wherein the inductances of the transformer windings are larger than 0.9 times the inductance L of a conductor path of the gradient coil. This facilitates good stability of the current control for the various current power supplies.

One further development is preferred, with which the inductances of the transformer windings are larger than 0.98 times the inductance L of a conductor path of the gradient coil. It has turned out that an even better stability of the current controls of the various current power supplies is thereby achieved.

An embodiment of the invention is furthermore preferred with which the inductances of the transformer windings are less than 2 times the inductance L of a conductor path of the gradient coil. This stabilizes the current controls of the various current power supplies. In addition, the inductances of the transformer windings and the associated generally disadvantageous differences in inductances, e.g. due to production tolerances, remain relatively small. With such inductance differences, the transformer would represent an inductive resistance to thereby reduce the dynamic characteristic variable kdyn.

An embodiment of the invention is preferred, with which the transformers comprise an iron core. In this manner, preferred values for the winding inductances of the transformers can be realized with transformers of compact construction and small numbers of transformer windings. Particularly preferred are annular iron cores with an air gap of adjustable width.

An embodiment of the invention is preferred with which the transformer has a considerably lower number of windings, i.e. at least by a factor of 5, than a conductor path of the gradient coil. This facilitates windings with very small ohmic resistances.

An embodiment of the invention is preferred, in which the current power supplies are cycled switching power supplies. The current controls of cycled switching power supplies are often particularly sensitive with respect to oscillations. The control circuits of the various controls which are, in principle, inductively connected to one another via the gradient coil, can be decoupled via transformers.

An embodiment of the invention is particularly preferred, in which the gradient coil comprises a field coil and a shielding coil and is actively shielded, wherein the conductor paths extend within both the gradient coil and the shielding coil. This avoids perturbations in the magnetic field generated by the gradient coil via additional fields caused by eddy currents in the metal structures of the main field magnet.

An embodiment of the invention is particularly preferred with which the conductor paths of the gradient coil are streamline-shaped, i.e. the conductor paths, separated from one another by a groove, are cut out from a copper or aluminium plate. Such streamline-shaped magnet coils have particularly large conductor cross-sections and therefore particularly low ohmic losses.

In an alternative embodiment of the invention, the conductor paths of the gradient coil are wound from wire. This facilitates particularly inexpensive production of the gradient coil.

Further advantages can be extracted from the drawing and the description. The features mentioned above and below can be used in accordance with the invention either individually or collectively in any arbitrary combination. The embodiments shown and described are not to be taken as exhaustive enumeration, rather have exemplary character for describing the invention.

The invention is shown in the drawing and is further described by means of embodiments.

DESCRIPTION OF THE PREFERRED EMBODIMENT

Figure 3:
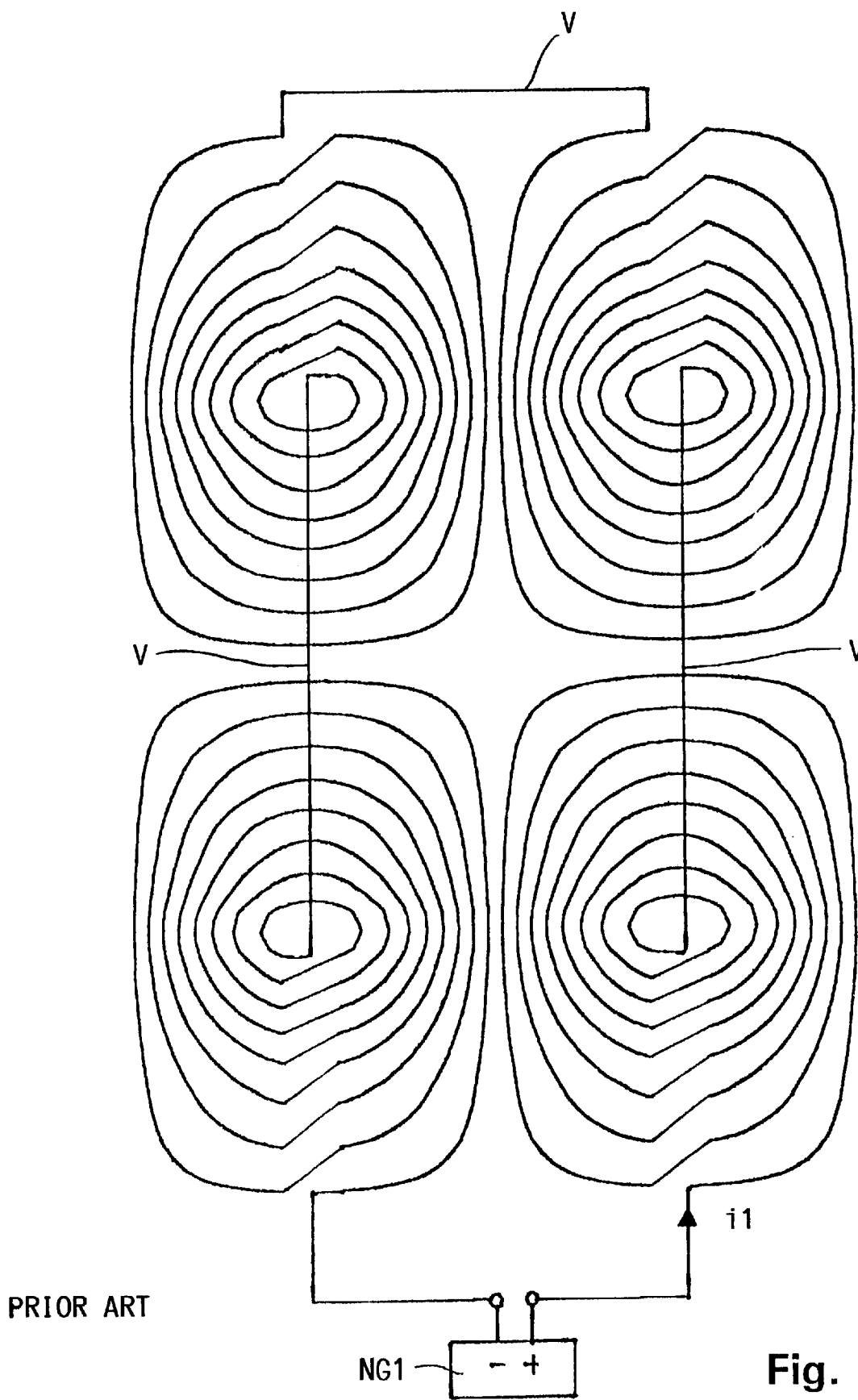
FIG. 3 shows an unfolded transverse gradient coil according to prior art with a wire conductor path and one current power supply.

The conventional transverse gradient coil shown in FIG. 3, comprising a current power supply NG1 provides a basis of comparison for further embodiments. The coil comprises a conductor path supplied with current i1 which varies with time and is controlled by the current power supply NG1. The performance data of this comparative system are provided with the index "rev" and are designated as follows:

g0=g0rev
L=Lrev
Imax=Imaxrev
Umax=Umaxrev
(dg/dt)max=(dg/dt)maxrev=g0rev*Umaxrev/Lrev
kdyn=kdynrev=(g0rev*g0rev)/Lrev*Imaxrev*Umaxrev The performance data for the current power supplies, Imax2 and Umax2, are identical for all devices in the figures.

The geometry of the connecting conductor V, connecting the four partial coils of the gradient coil to one another, is shown in all figures in a simplified manner for reasons of clarity.

Figure 2:
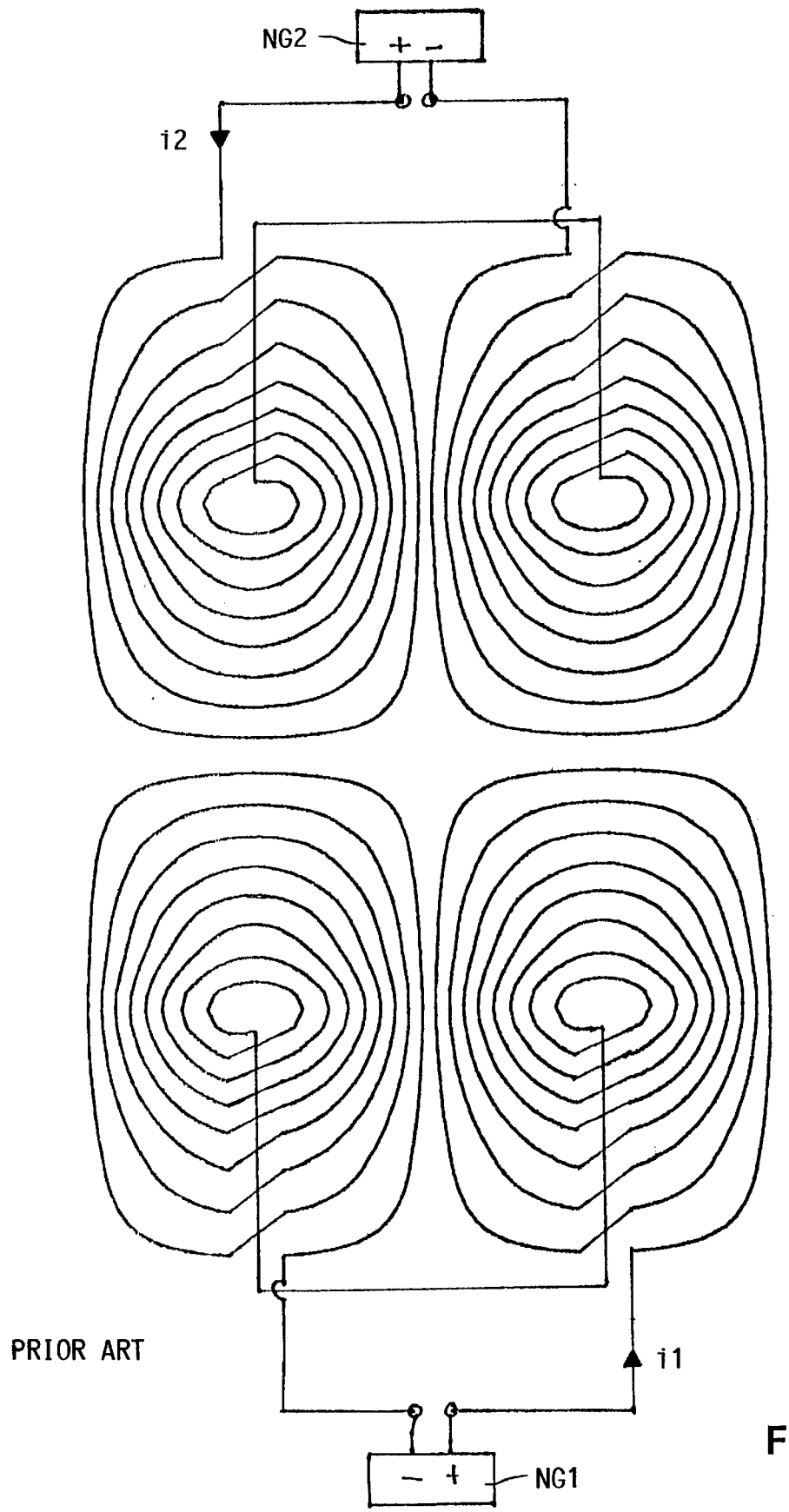
FIG. 2 shows an unfolded transverse gradient coil according to prior art with two wire conductor paths and two current power supplies.

FIG. 2 shows an electric arrangement with a gradient coil which also comprises four partial coils and two current power supplies NG1 and NG2, corresponding to U.S. Pat. No. 4,928,063. The gradient coil has two separate conductor paths which are not parallel to one another. These are supplied with the currents i1 and i2, controlled by the current power supplies, which vary with time and which are identical, apart from regulation tolerances. The dynamic performance data of this arrangement is:

gmax=gmaxrev
(dg/dt)max=2*(dg/dt)maxrev
kdyn=2*kdynrev

The dynamic characteristic variable kdyn thereby has twice the value as in the arrangement of FIG. 3, having only one current power supply. This arrangement has the disadvantage that, if the currents i1 and i2 are not completely identical, e.g. due to regulation tolerances, spatially dependent magnetic field perturbations are produced which completely differ from the desired geometry for the gradient coil.

Figure 1:
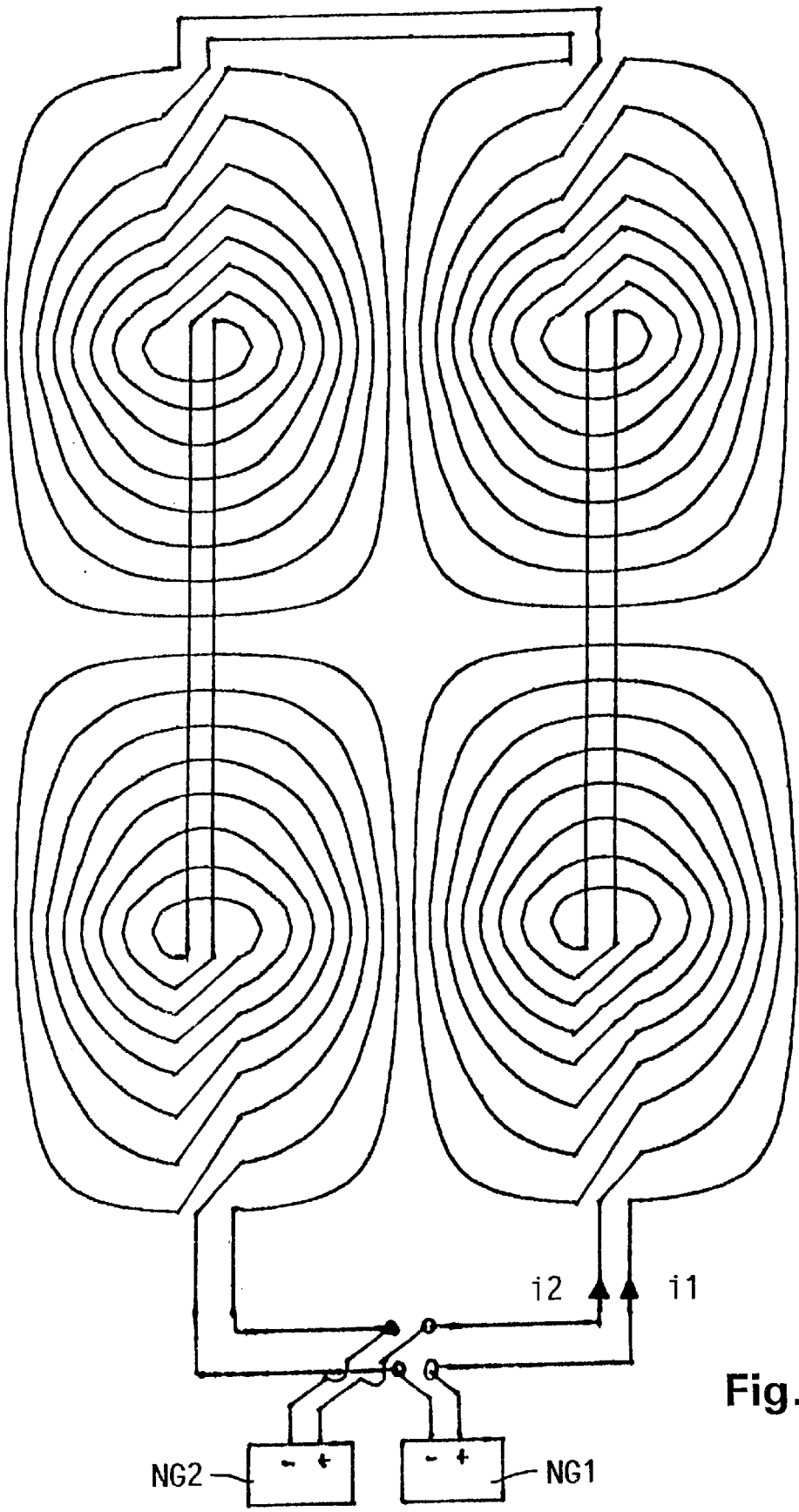
FIG. 1 shows an unfolded transverse gradient coil in accordance with the invention with two parallel wire conductor paths and two current power supplies.

The arrangement in accordance with the invention of FIG. 1, has the same dynamic performance data as the arrangement of FIG. 2. Since the two mutually parallel conductor paths individually generate magnetic fields essentially having the same geometry, perturbing magnetic fields of different geometry are prevented when the currents i1 and i2 are not completely identical. The dynamic performance data of this arrangement is:

gmax=gmaxrev
(dg/dt)max=2*(dg/dt)maxrev
kdyn=2*kdynrev

Each of the two conductor paths of the gradient coil of FIG. 1, which comprise four partial coils, have only half the number of windings as the single conductor path of the reference system of FIG. 3. The inductance L of each conductor path, which is proportional to the square of the number of windings, is therefore approximately Lrev/4. Since the two conductor paths are close to each other along their entire travel, the mutual inductance between the two conductor paths is also approximately Lrev/4. During charging e.g. of the conductor path to which the current i1 is supplied, $$U=L*(di/dt)+M*(di2/dt).$$

Wherein U is the inductive part of the electric voltage supplied by a current power supply to each of the two conductor paths.

With L=M=Lrev/4 and (di1/dt)=(di2/dt)=(di/dt):

$$U=(Lrev/2)*(di/dt).$$

This shows that, when the conductor paths are simultaneously operated, each of the two current power supplies is effectively charged with only half the inductance Lrev of the reference coil of FIG. 3.

Figure 4:
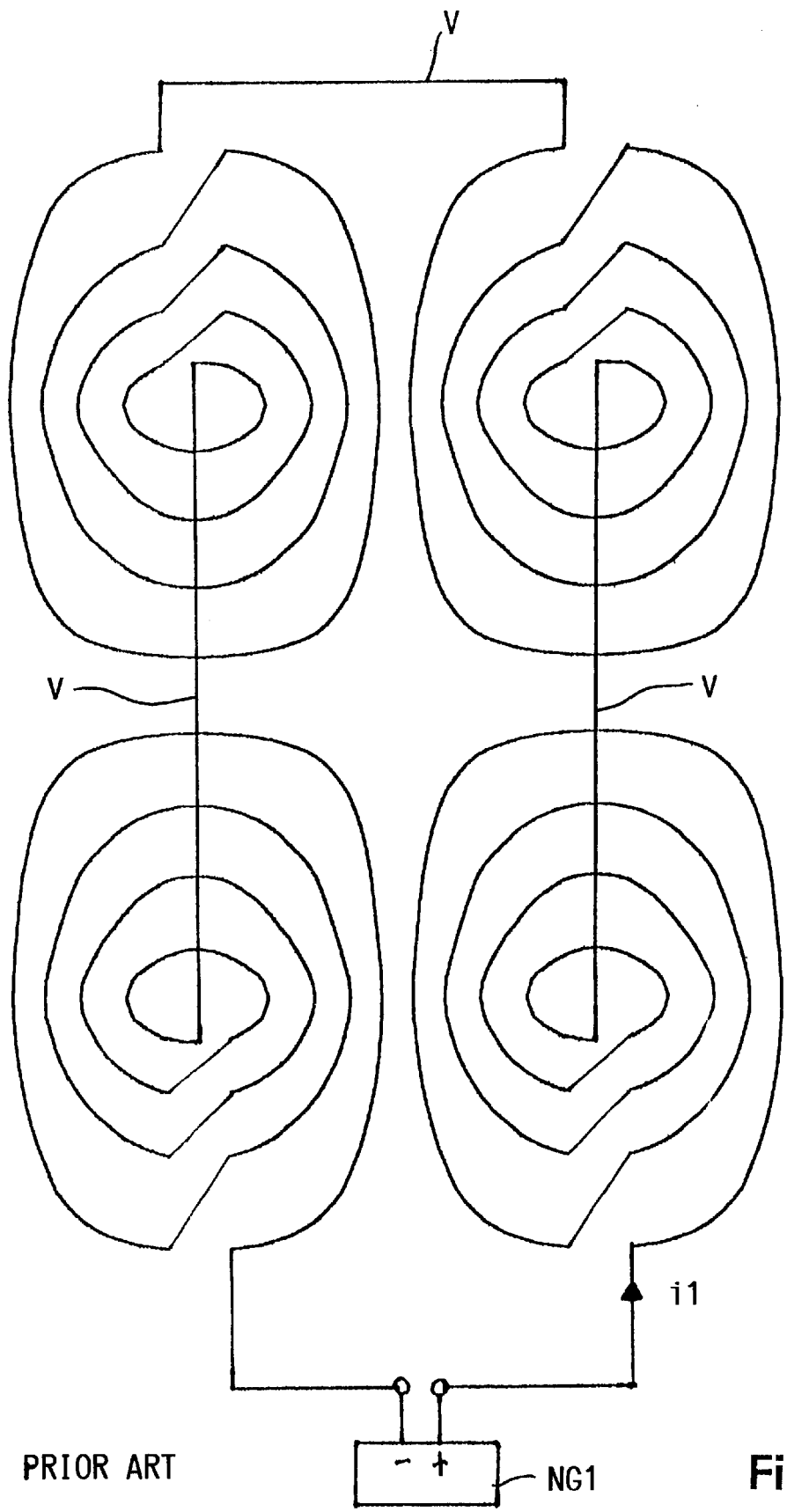
FIG. 4 shows an unfolded transverse gradient coil according to prior art with a wire conductor path and one current power supply, wherein the number of windings is half the number of the gradient coil of FIG. 3 and is identical to the number of windings of the conductor paths of the gradient coil in FIG. 1.

The prior art gradient coil of FIG. 4 also comprises only half the number of windings of the reference system of FIG. 3. The dynamic performance data is thereby:

g0=g0rev/2
L=Lrev/4
gmax=gmaxrev/2
(dg/dt)max=(dg/dt)maxrev/2
kdyn=kdynrev.

The dynamic characteristic variable kdyn is therefore identical to that of the reference system of FIG. 3, although g0 and L have different values.

Figure 5:
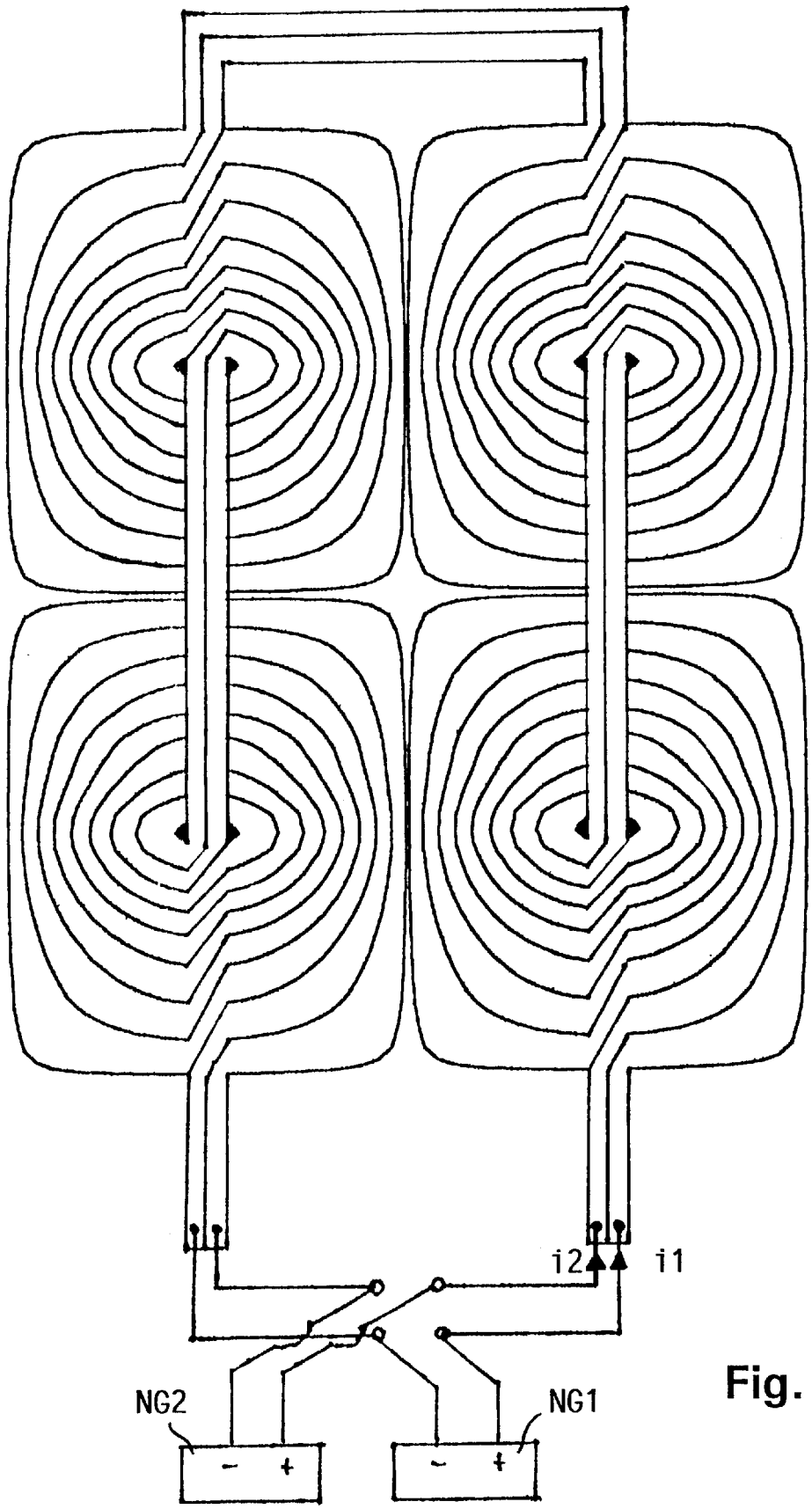
FIG. 5 shows an unfolded transverse gradient coil with two parallel conductor paths and two current power supplies as in FIG. 1, however with streamline conductor paths.

In the arrangement in accordance with the invention, shown in FIG. 5, having band-shaped streamline conductor paths, the lines shown in the gradient coil do not represent wires but lines of separation between conducting paths. The dynamic performance data is the same as in the system of FIG. 1.

Figure 6:
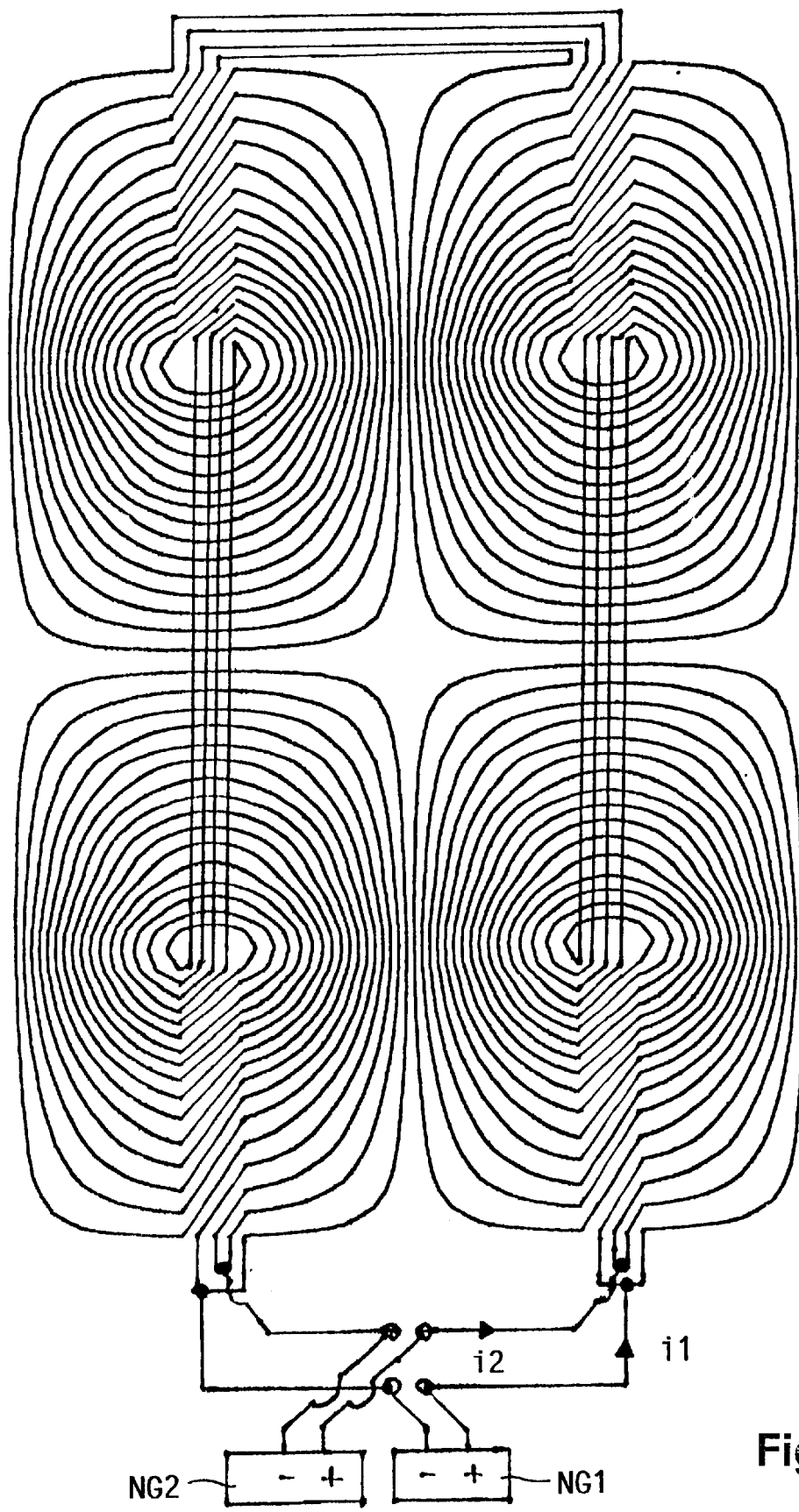
FIG. 6 shows an unfolded transverse gradient coil in accordance with the invention with four parallel partial conductor paths consisting of wires and two current power supplies, wherein each of two partial conductor paths are connected in parallel to thereby form two new conductor paths.

The arrangement shown in FIG. 6 has the same dynamic performance data as the arrangement of FIG. 1. In this case, each of the two conductor paths consists of a parallel connection of two partial conductor paths. If both partial conductor paths have the same inductance and the same electric resistance, the same electric current flows in both partial conductor paths of a parallel circuit at all times. Since the two partial conductor paths which are supplied with the current i1 "surround" the two partial conductor paths to which the current i2 is supplied along their entire length, both conductor paths generate, with high precision, magnetic fields of identical geometry. With streamline conductor paths or partial conductor paths which are only separated from one another by grooves, this embodiment of the gradient coil has, compared with the embodiment according to FIG. 1, the advantage that the width of the conductor paths or partial conductor paths is halved and for this reason, when the current strength changes quickly, only limited amounts of eddy currents are generated in the partial conductor paths which would otherwise lead to time-dependent disturbances in the magnetic field generated by the gradient coil and to heating up of the conductors.

Figure 7:
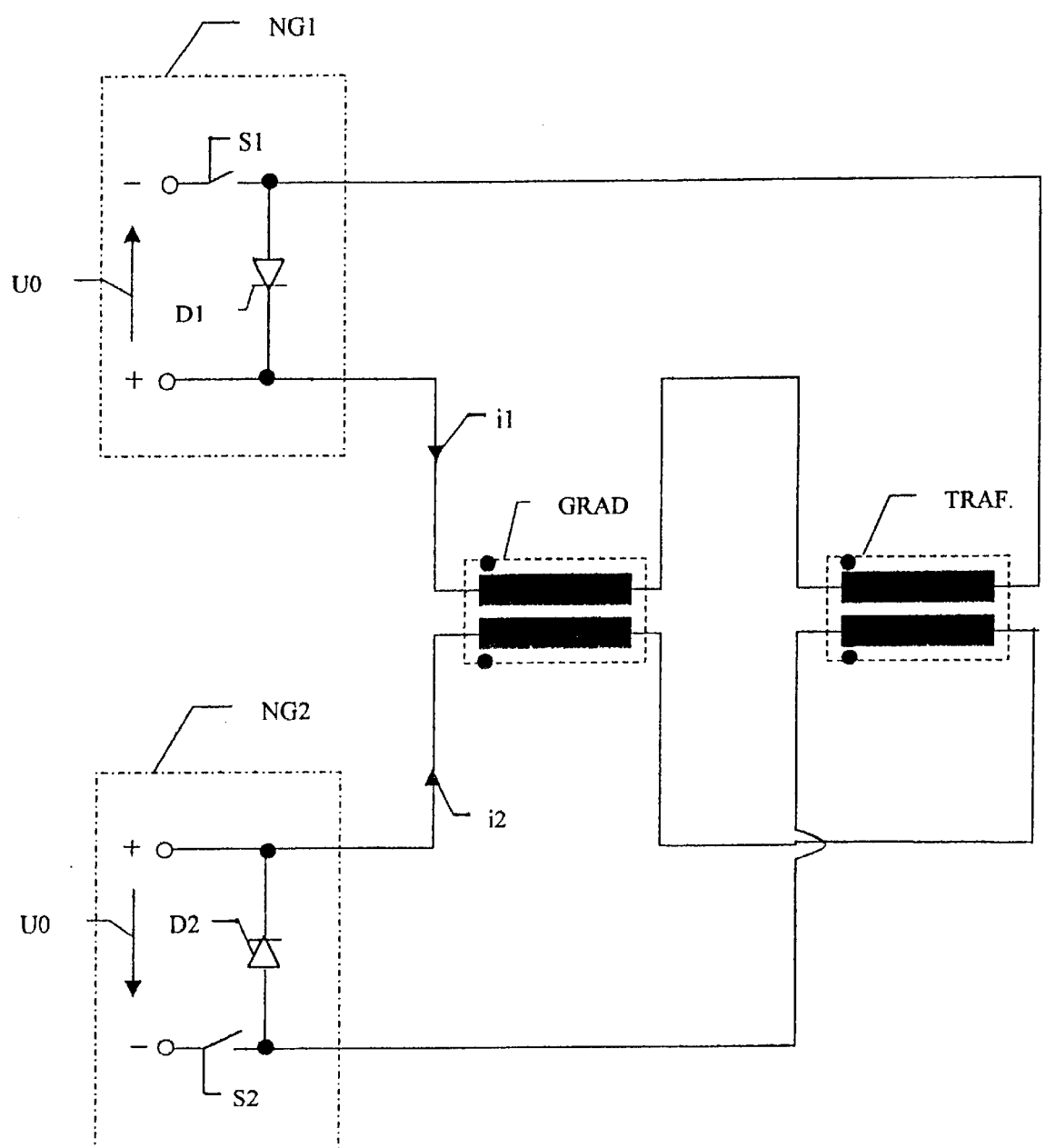
FIG. 7 shows an electric arrangement with two current power supplies, a gradient coil with two conductor paths and a transformer.

FIG. 7 illustrates the function of an arrangement having two current power supplies (NG1 and NG2), a gradient coil (GRAD) with two conductor paths and a transformer (TRAF). The current power supplies are shown in a highly simplified manner as switchable power supplies for a specific operating state with positive currents i1 and i2 and positive current changes with time of (di1/dt) and (di2/dt). Both supply a constant supply voltage U0 of several 100 V. When the switch S1 is closed, this supply voltage is present as a charging voltage at the conductor path into which the current i1 is supplied and at the winding of the transformer connected in series thereto. According to the inductance law, this causes, in general, a change in the current i1. In this state, the recovery diode D1 is blocked and without current. When the switch S1 is open, the current i1 flows via the recovery diode D1, which then approximates a short circuit. Through selection of the time intervals in which the switch S1 is open or closed, the rise time of the current i1 can be controlled. The relationships in the circuit supplied with current i2 from the second current power supply NG2 are analogous. Due to inductive coupling of the two conductor paths of the gradient coil and the two windings of the transformer, the current controls of both power supplies NG1 and NG2 are, in principle, coupled to one another and can therefore interfere with one another. The electric load on the power supply NG1 depends, in principle, on the state of the switch S2 which controls the time dependence of the current i2. For the circuit having current i1:

$$U1=Lg*(di1/dt+di2/dt)+Lt*(di1/dt-di2/dt),$$

wherein Lg is the inductance (equal to the mutual inductance) of the conductor paths of the gradient coil, Lt, the inductance (equal to the mutual inductance) of the transformer windings, and U1, the electric voltage generated by the power supply NG1 U1=U0 when the switch Si is closed and U1=0 when the switch S1 is open.

Analogously, the following holds for the circuit through which the current i2 flows:

$$U2=Lg*(di1/dt+di2/dt)-Lt*(di1/dt-di2/dt),$$

wherein U2 is the electric voltage generated by the power supply NG2 and U2=U0 when the switch S2 is closed or U2=0 when the switch S2 is open.

If Lt is selected such that: Lt=Lg=L, then:
U1=2*L*(di1/dt)
U2=2*L*(di2/dt)

Consequently, the rate of change with time (di1/dt) depends only on U1, i.e. on the state of the switch S1 and not on (di2/dt) or U2, i.e. not on the state of the switch S2. This is also true for the rate of change with time (di2/dt). If the inductance of the transformer windings is set equal to the inductance of the conductor paths of the gradient coil, the circuits fed by the two power supplies are decoupled from one another and the controls of the power supplies do not influence one another. When so-called C-cores are used for the iron core of the transformer, the inductance of the transformer windings can be set by selecting the width of the air gap.

If the transformer is not installed (Lt=0), and S1 is closed and S2 is open: (di1/dt)=−(di2/dt)="infinite". This characterizes an unstable situation.

We claim:

1. A gradient coil system for generating a magnetic gradient field, which changes rapidly in time, in a working volume of a magnetic resonance apparatus, the system comprising:

a plurality of current power supplies, each of said plurality of power supplies being controlled by at least one of an analogue and a digital control signal such that said power supplies generate electric currents which remain substantially equal to one another at all times;

a gradient coil having coil windings fashioned on a surface of a geometric body to define a current track, said current track being divided into a plurality of current paths extending parallel to each other through said coil windings to each generate a partial gradient field of a same spatial dependence in the working volume, said current paths being insulated from each other and having substantially equal inductances and mutual inductances, each current path having ends connected to one of said power supplies; and a plurality of N−1 transformers, wherein a total of N said current power supplies are connected to a total of N said current paths with each of said N−1 transformers having a first and a second transformer winding each having approximately equal inductance and mutual inductance within a given transformer, wherein each of said N current paths is electrically connected in series to one of said first and said second windings of at least one transformer such that currents flowing in a same direction in said N current paths, flow in opposite directions through said first and said second transformer windings of each transformer.

2. The gradient coil system of claim 1, wherein at least one of said current paths is further divided into partial current paths, electrically connected in parallel.

3. The gradient coil system of claim 1, wherein said current paths have substantially equal electrical resistances.

4. The gradient coil system of claim 1, wherein N=2.

5. The gradient coil system of claim 1, wherein said first and said second transformer windings each have an inductance larger than 0.9 times an inductance of each of said plurality of current paths.

6. The gradient coil system of claim 5, wherein said first and said second transformer windings each have inductances larger than 0.98 times inductances of each of said current paths.

7. The gradient coil system of claim 1, wherein each of said first and said second transformer windings has an inductance smaller than two times an inductance of each of said current paths.

8. The gradient coil system of claim 1, wherein at least one of said N−1 transformers comprises an iron core.

9. The gradient coil system of claim 1, wherein at least one of said N−1 transformers has a number of windings at least 5 times less than a number of current path windings.

10. The gradient coil system of claim 1, wherein said current power supplies are cycled switching power supplies.

11. The gradient coil system of claim 1, wherein said gradient coil is actively shielded and comprises a field coil and a shielding coil, wherein said current paths travel through both said field coil and said shielding coil.

12. The gradient coil system of claim 1, wherein said current paths are shaped in a streamlined manner.

13. The gradient coil system of claim 1, wherein said current paths comprise wires.

* * * * *